455-612    AU 233        EX
FIP8106    XR    4,027,152

United States Patent [19]
Brown et al.

[11] 4,027,152
[45] May 31, 1977

[54] APPARATUS AND METHOD FOR TRANSMITTING BINARY-CODED INFORMATION

[75] Inventors: William W. Brown, Sunnyvale; Delon C. Hanson; Thomas Hornak, both of Los Altos, all of Calif.

[73] Assignee: Hewlett-Packard Company, Palo Alto, Calif.

[22] Filed: Nov. 28, 1975

[21] Appl. No.: 636,004

[52] U.S. Cl. .................................. 250/199; 360/39; 178/68; 328/151
[51] Int. Cl.² .......................................... H04B 9/00
[58] Field of Search .................. 325/38 B; 250/199; 178/68; 307/235 C; 328/151; 360/40, 48, 51, 39; 340/173 DR

[56] References Cited
UNITED STATES PATENTS

| | | |
|---|---|---|
| 2,954,267 | 9/1960 | Canepa ............................ 325/38 A |
| 3,402,352 | 9/1968 | Lerner .............................. 325/38 B |
| 3,528,011 | 9/1970 | Anderson ......................... 250/199 |
| 3,778,725 | 12/1973 | Spaargaren ....................... 328/151 |
| 3,809,908 | 5/1974 | Clanton ............................. 250/199 |
| 3,858,184 | 12/1974 | DeVries ....................... 340/173 DR |

Primary Examiner—Benedict V. Safourek
Assistant Examiner—Michael A. Masinick
Attorney, Agent, or Firm—Patrick J. Barrett

[57] ABSTRACT

An apparatus is disclosed for transmitting binary-coded information over a fiber-optic link which provides a link monitor to indicate whether the fiber-optic link is intact and operating. The binary-coded information is translated into a pulse-coded signal which provides a positive pulse for a positive-going transition in the binary signal and a negative pulse for a negative-going transition in the binary signal. In addition, a refresh pulse of the same polarity as the preceding pulse is provided whenever there has been no pulse for a predetermined amount of time.

14 Claims, 13 Drawing Figures

APPARATUS AND METHOD FOR TRANSMITTING BINARY-CODED INFORMATION

BACKGROUND OF THE INVENTION

Binary-coded information is widely used in industry today, both for computational purposes and for control of equipment and machinery. Frequently a computer is used to control equipment that may be located remotely from the computer, and it is necessary to provide a communications link between the computer and the equipment. If a computer is controlling many operations or controlling a number of different pieces of equipment, it is frequently necessary to have a data link that will provide high communication rates and good isolation from interference. Fiber-optic links meet these criteria well due to he high bandwidth possible with optical signals and the fact that a fiber-optic cable can be easily isolated from interfering signals.

One of the problems encountered to date, however, in using fiber-optic data links is the need to generate optical signals that can be easily and umambiguously decoded at the other end of a fiber-optic cable. A straight binary signal, i.e. turning a light "on" for a high state and "off" for a low state, may, of course, be used; but such a signal presents several problems in decoding. Since control signals used in process-control applications may have varying rates and may not be synchronous with a clock, it is necessary for the receiver to have full gain at D.C. as well as frequencies up to and including the maximum data for an asynchronous control signal that may stay indefinitely in the high or low state. Due to the high gain at D.C. and low frequencies, such a system is susceptible to zero drift, low frequency noise and other forms of interference. In addition, there is no way of knowing whether a low state that is indicated by the absence of light is due to the data transmitted or a break in the optical link.

Numerous codes have been proposed and used in an effort to solve the problems indicated in the foregoing paragraph. One of the best-known codes is known as the Manchester code, which comprises a signal at a constant frequency which is equal to the highest data rate of the binary information to be encoded. The phase of the Manchester-coded signal is either 0° or 180° according to the binary information and the phase of the signal can be detected and decoded to reconstitute a binary signal. While this signal overcomes the problems of low frequency noise interference, since full gain at D.C. is not required of the receiver, it has the problems that it is inefficient in the use of bandwidth and that time quantization is necesary, preventing the transmission of pulse trains with continuously variable frequency. It does, however, provide an indication of whether the link is operative or not. Other codes have also been proposed which have similar problems. They are described, for example, in *Proceedings of the IEEE*, "Line-Coding Plan for Fiber-Optic Communications Systems" by Y. Takasaki, et al., page 1081 to 1082, July 1975 and IBM *Journal of Research Development*, "Introduction to Pseudoternary Transmission Codes" by A. Croisier, page 354 to 367, July 1970.

SUMMARY OF THE INVENTION

According to the preferred embodiment of the present invention, an apparatus is provided for converting a binary-coded signal into a pulse-coded signal that includes a refresh pulse to indicate that the data link is operative. A data pulse is generated for each transition of the binary-coded signal from one state to the other state and the polarity of the data pulse corresponds with the direction of the transition. In addition, if a transition has not occurred for some predetermined amount of time, a refresh pulse will be generated and will continue to be generated with the same polarity as the last generated data pulse until another data pulse is generated, thus providing a continuous indication that the data link is intact and that the binary-coded signal has not changed. The pulses in an optical communications system may be generated using a light-emitting diode which, in the system quiescent state, is radiating at about half-brightness. When the binary-coded signal being supplied to the apparatus changes, for example, from the low state to the high state, the light-emitting diode is pulsed to full-brightness coincident with the transition in the binary signal. If the binary signal then remains high for more than a predetermined amount of time, the light-emitting diode will again be pulsed to full-brightness to indicate that the binary signal is still high. When the binary signal goes low, the light-emitting diode will be momentarily pulsed off and then will return to half-brightness. Once again, if the binary signal stays low for more than the predetermined amount of time, the light-emitting diode will again be pulsed off to indicate that the signal is still low.

This pulsed-optical signal will be detected by a receiver at the other end of a fiber-optic cable, and the optical signal will be converted back into an electrical signal. The electrical signal is amplified and compared with predetermined threshold values. When the electrical signal goes above the threshold value, this is detected as a positive pulse, and a memory element stores a binary "one." Thus, during the time the source-binary signal is high, the output of the memory element is also high. When a negative pulse is received, relative to the established mid-level value, the memory element will then change to its low state, thus corresponding to the low state of the source-binary signal.

In addition to the foregoing, the peak value of the incoming signal is continuously detected and is used to control an AGC amplifier for the incoming signal. This peak detector output signal is also compared with a predetermined threshold level to indicate whether the link is operative. So long as data and refresh pulses continue to be received, the output of the peak detector will remain above the threshold, thus indicating an active link. If there is a break in the link, the output of the peak detector will fall, indicating that good data is no longer being received.

DESCRIPTION OF THE PREFERRED EMBODIMENT

Figure 1:
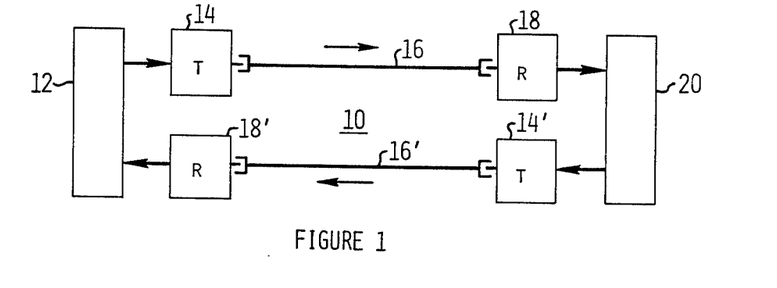
FIG. 1 shows a block diagram of a fiber-optic communication link.

FIG. 1 shows a typical fiber-optic communications system 10 comprising a binary signal source 12, such as a computer, for example, coupled to an optical transmitter 14 which is coupled by a fiber-optic cable 16 to an optical receiver 18. Receiver 18, in turn, is connected to a device 20 which utilizes the binary information from device 12. In many situations, device 20 will also send information back to device 12 over a similar fiber-optic link such as that provided by transmitter 14', fiber-optic cable 16', and receiver 18'. There are, of course, many other configurations that can be used for fiber-optic communication links and the foregoing is offered only as an example.

Figure 2:
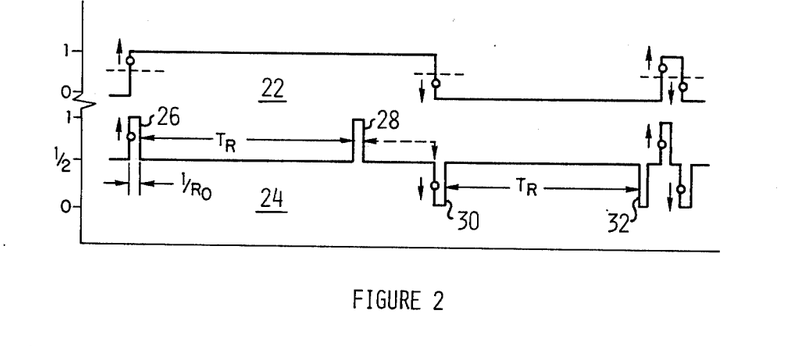
FIG. 2 shows a graphical representation of signals in the preferred embodiment of the present invention.

FIG. 2 shows a graphical representation of a binary-coded signal 22 and a pulse-coded signal 24. As is well known, a binary-coded signal varies between two levels, here indicated as 1 and 0. The pulse-coded signal generated in accordance with this invention has a quiescent level labelled ½ in FIG. 2. When the input binary-coded signal changes from 0 to 1, a momentary pulse 26 having a level labelled 1 is generated to indicate the change in state of the binary-coded signal. This pulse lasts for a period of $1/R_0$, where $R_0$ is the maximum signaling rate. The signal then returns to the quiescent level and if there are no changes in the level of the binary-coded signal for a period of time equal to $T_R$, a refresh pulse 28 is produced. These refresh pulses will continue to be produced until there is a change in the level of the binary-coded signal. When the binary-coded signal drops back to the 0 level, a data pulse 30 having a level labelled 0 will be produced, again with a duration of $1/R_0$. The signal will again return to the quiescent state and remain there either until the binary-coded signal changes state or a refresh pulse, such a pulse 32, is generated. The three signal levels called for in the pulse-coded signal may be generated, for example, by a light source which is maintained at about half of its maximum output and is pulsed either to an off condition or its maximum output level. Likewise, if electrical signals are used for the pulse, the quiescent level could be zero volts and the one and zero levels could be corresponding positive and negative voltage levels.

Figure 3:
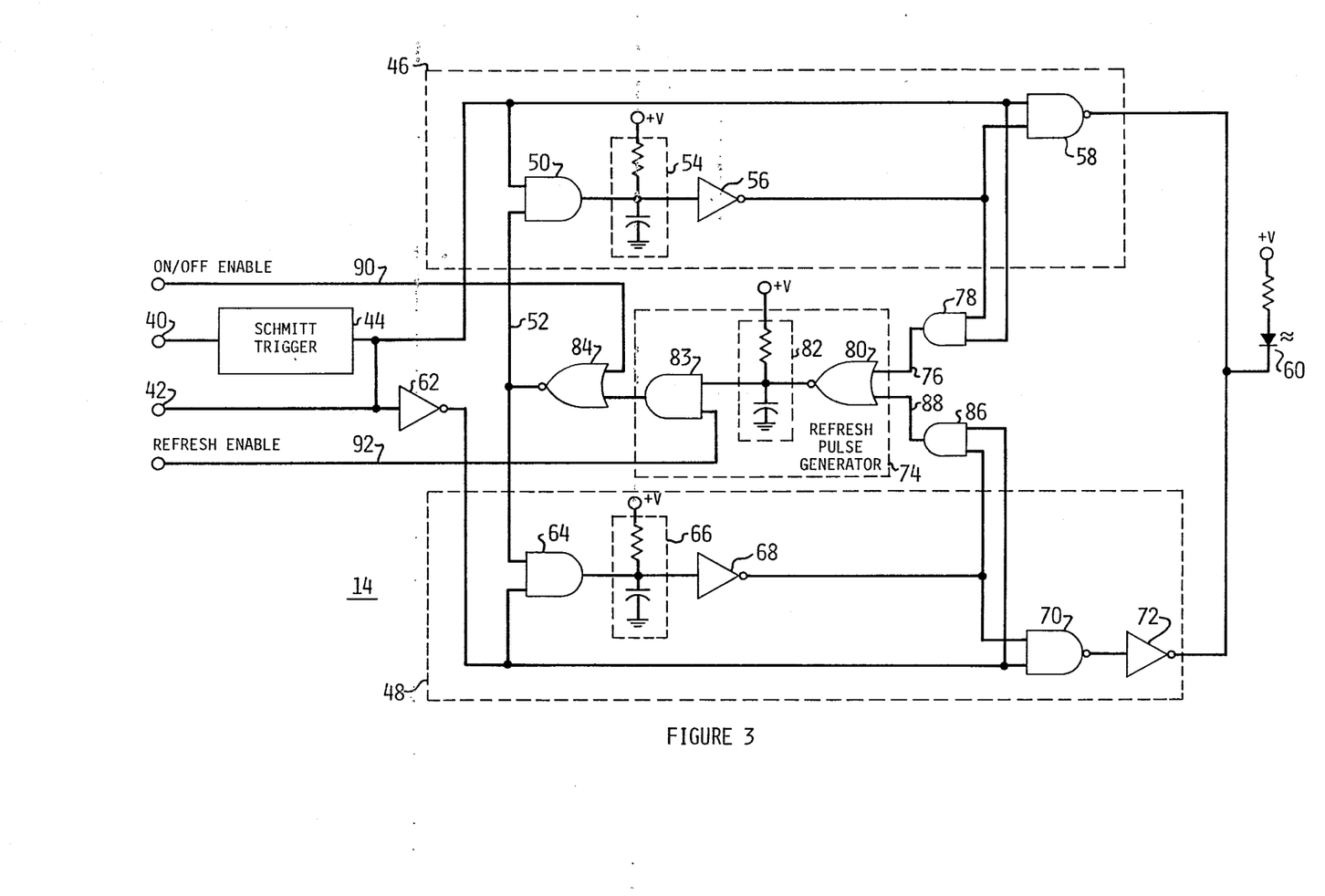
FIG. 3 shows a schematic diagram of a transmitter according to the preferred embodiment of the present invention.

FIG. 3 shows a preferred embodiment of a transmitter used to generate the pulse-coded signal shown in FIG. 2. Transmitter 14 has two inputs, 40 and 42. Input 40 is connected to a Schmitt trigger 44 which is used to regenerate the transitions on binary-coded signals that do not have sharp leading and trailing edges. Those signals that are properly shaped can be applied to input 42. The input binary-coded signal is supplied to two pulse generating circuits, 46 and 48. Pulse generating circuit 46 will generate a positive-going output pulse, such as pulse 26, when the binary-coded signal changes from a low to a high level. The binary-coded signal is applied to one input of an AND gate 50. The other input of the AND gate is connected to a line 52 which is maintained at a high level, as will be explained in more detail subsequently. With a binary-coded signal changing from a low level and remaining at a high level, the output signal from AND gate 50 will go high after a time period determined by a delay circuit 54 and will remain high. The signal is inverted by an inverter 56 and is applied to one input of a NAND gate 58. The other input of NAND gate 58 also receives the binary-coded signal, and when this signal goes high, the output of NAND gate 58 will go low. After the period determined by the delay circuit 54, the output of inverter 56 will go low and the output of NAND gate 58 will return to high. The output pulse from NAND gate 58 is then applied to a light-emitting diode 60 as will be described in greater detail below.

The binary-coded signal also passes through an inverter 62 to pulse-generating circuit 48, and the inverted binary-coded signal is applied to an AND gate 64 and a NAND gate 70. AND gate 64 and the associated time-delay circuit 66, inverter 68 and NAND gate 70 operate in the manner described for the similar components in pulse-generating circuit 46. However, due to inverter 62, pulse-generating circuit responds to changes in the binary-coded signal from a high level to a low level, complementary to the response of pulse-generating circuit 46. The output of NAND gate 70 is connected to an inverter 72 so that while the output of NAND gate 70 is normally high, the output of the inverter 72 is normally low. Inverter 72 therefore acts as a current sink for LED 60 and it sinks about half of the current used for normal radiance of the LED. Thus the LED is on at approximately half-radiance when no pulses are being generated by either of the pulse-generating circuits. When pulse-generating circuit 46 generates a pulse, NAND gate 58 sinks additional current from LED 60, increasing the radiance of the LED. Conversely, when pulse-generating circuit 48 generates a pulse, the output of inverter 72 goes high, shutting off the current sink, thereby shutting off LED 60.

As mentioned above, when the binary-coded signal remains in one state for more than a predetermined amount of time, a refresh signal is generated and the predetermined amount of time is determined by a refresh pulse generator 74. The refresh pulse generator has an input 76 connected to the inputs of NAND gate 58 via AND gate 78 and an input 88 connected to the inputs of NAND gate 70 via AND gate 86. When, as a response to a transition in the binary-coded input signal, a pulse of duration $1/R_0$ appears at the output of NAND gate 58 or 70, a high state of the same duration $1/R_0$ appears on input 76 or 88, both inputs being normally low. Inputs 76 and 88 are connected to a NOR gate 80 in the refresh pulse generator 74. The output of NOR gate 80 is connected to a delay circuit 82, which, in turn, is connected via AND gate 83 to one input of a NOR gate 84. The other input of AND gate 83 is assumed to be permanently high, and the other input of NOR gate 84 is assumed to be permanently low. A low to high transition at either input of NOR gate 80 generates a high to low transition at the output of NOR gate 80. This transition is delayed by delay circuit 82 insignificantly; thus, the output of NOR gate 80 reaches a low state within the duration $1/R_0$ of the high state on input 76 or 88. After the pulse at the output of NAND gate 58 or 70, indicating a transition in the binary-coded input signal, has expired, a state with both inputs of NOR gate 80 being low is restored. Thus, the output of NOR gate 80 goes through a low to high transition.

This transition is significantly slowed down by delay circuit 82. The time interval $T_R$ between the return of a state with both inputs of NOR gate 80 low and the output of NOR gate 80 reaching a high state is designed to be typically 100 times the pulse duration $1/R_O$ on the output of NAND gate 58 or 70 in the preferred embodiment.

Now, if transitions in the binary-coded input signal occur at a rate at which the time interval between subsequent transitions does not exceed time interval $T_R$, the output of NOR gate 80 never reaches a high state and the output of NOR gate 84 remains constantly high. However, if a transition in the binary-coded input signal is not followed by a subsequent transition within the time interval $T_R$, the output of NOR gate 80 does reach a high state, switching the output of NOR gate 84 to a low. The output signal of NOR gate 84 drives line 52 to the inputs of AND gates 50 and 64.

If the binary-coded input signal remains in a high state, the high to low transition at the output of NOR gate 84 generates a high to low transition at the output of AND gate 50. The output of AND gate 64, held low by the low state output of inverter 62, remains low and experiences no transition.

If the binary-coded input signal remains in a low state, the high to low transition at the output of NOR gate 84 appears also at the output of AND gate 64 because its other input, driven by inverter 62, is now high. The output of AND gate 50 is now low and sees no transition because the other input of that gate is held low by the binary-coded input signal.

The high to low transition at the output of AND gate 50 or 64 is only insignificantly influenced by delay circuits 54 and 66 respectively, resulting in a fast low to high transition at the output of inverter 56 when the binary-coded input signal is high, or at the output of inverter 68 when the binary-coded input signal is low. With binary-coded input signal high, one input of NAND gate 58 and one input of AND gate 78 is high. This, combined with the low to high transition coming from the output of inverter 56 to the other inputs of NAND gate 58 and AND gate 78 starts a pulse at the output of NAND gate 58 and generates a low to high transition at the output of AND gate 78. Conversely, with binary-coded input signal low, a pulse is started at the output of NAND gate 70 and a low to high transition is generated in the output of AND gate 86. The low to high transition applied via inputs 76 or 88 to the inputs of NOR gate 80, generates a high to low transition at the output of NOR gate 80. As mentioned before, a high to low transition is only insignificantly influenced by delay circuit 82. As a result, the output of NOR gate 84, connected via line 52 to the inputs of AND gates 50 and 64, returns from low to high.

If the binary-coded input signal remains in a high state, the output of AND gate 50 begins a low to high transition, slowed down by delay circuit 54. After reaching a high state, the output of inverter 56 goes low, terminating the pulse at the output of NAND gate 58 and the high state at the output of AND gate 78. Thus, the output of NOR gate 80 begins a new low to high transition slowed down by delay circuit 82 for a new time interval $T_R$. At the same time, the output of AND gate 64 remains held low by the low state at its input connected to inverter 62 showing a low output when the binary-coded input signal is high.

If the binary-coded input remains in a low state, the above-mentioned low to high transition on line 52 generates a low to high transition at the output of AND gate 64, slowed down by delay circuit 68. At the same time, the output of AND gate 50 remains low. The high to low transition at the output of inverter 68 terminates the pulse at the output of NAND gate 70 and the high state at the output of AND gate 86, starting a new time interval $T_R$.

As a result of the described operation of the refresh pulse generator 74, a refresh pulse is generated in NAND gate 58 if the binary-coded input signal remains in a high state, and in NAND gate 70 if the binary-coded input signal remains in a low state. In both cases the refresh pulse is started a time interval $T_R$ after the termination of a previous refresh pulse or after a pulse caused by a transition in the binary-coded input signal.

Due to the difference between the generation of data pulses and refresh pulses, there is also a difference in the width of both pulses. The data pulse width is principally equal to the delay between a low to high transition at the input of AND gate 50 or 64 and the output of inverter 56 or 68. The refresh pulses are wider than the data pulses by the delay between a low to high transition applied to the input of AND gate 78 or 86 and the output of NOR gate 84. This delay includes the effect of delay circuit 82 on high to low transitions at the output of NOR gate 80 and this delay should be kept negligible if substantially equally wide refresh and data pulses are required.

Transmitter 14 is also provided with two inputs, On/Off Enable 90 and Refresh Enable 92. On/Off Enable allows the use of a qualifier signal to change the transmitter operation to a simple on and off mode in which a high level in the binary-coded input signal causes LED 60 to radiate at maximum brightness; and a low level causes LED 60 to be off. Refresh input 92 allows the use of a qualifier to turn off the refresh pulse generator and thus prevent the output of any refresh pulses.

Figure 4:
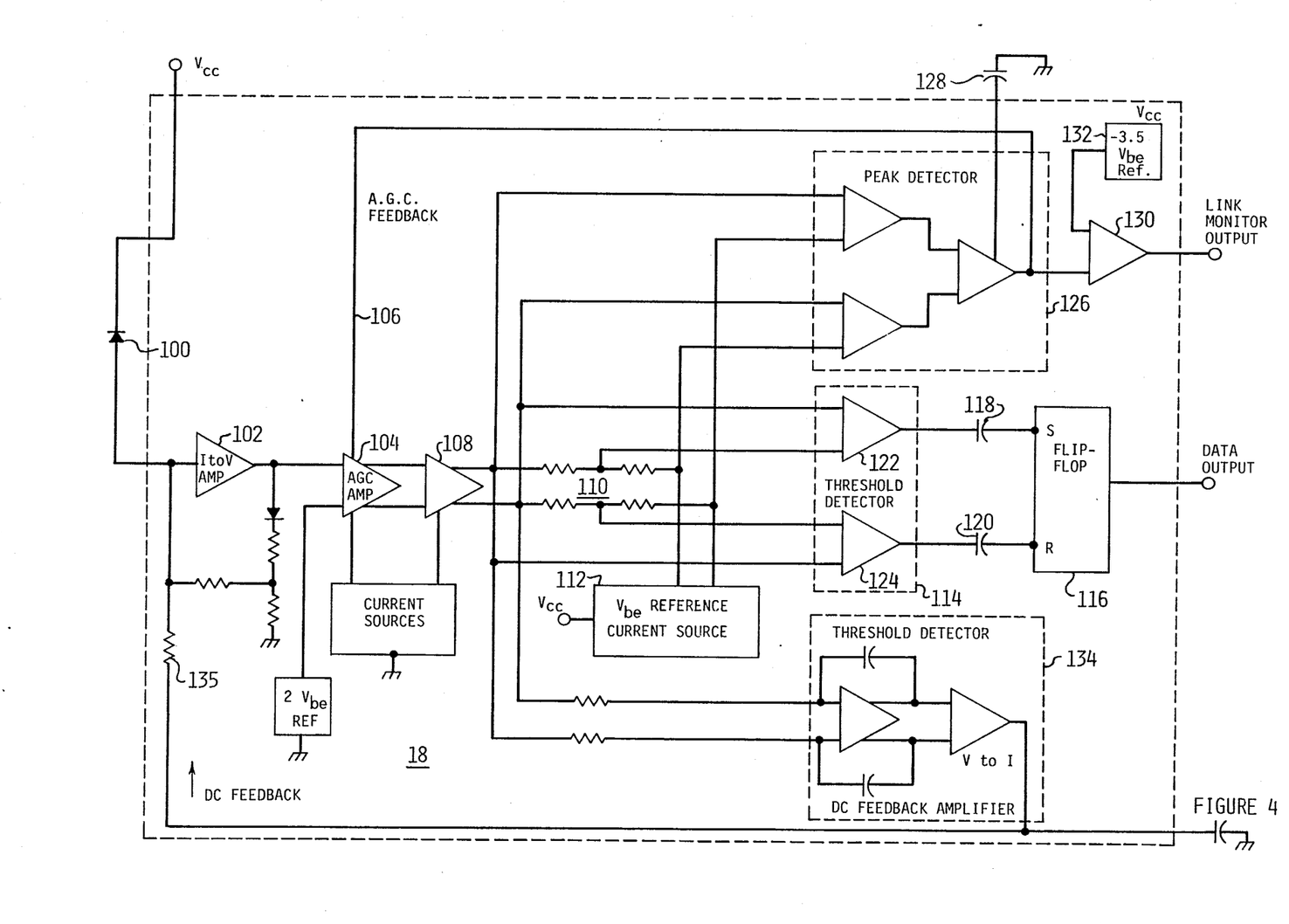
FIG. 4 shows a block diagram of a receiver according to the preferred embodiment of the present invention.

As shown in FIG. 1, light-emitting diode 60 is coupled, in practice, by fiber-optic cable 16 to a receiver 18. FIG. 4 shows a schematic diagram of a receiver 18 having at its input a light-detecting diode 100. The conduction of diode 100 varies with the light incident upon the diode and the diode is connected to the input of a current-to-voltage amplifier 102. The output of this amplifier is connected to an AGC amplifier 104 which receives an AGC feedback signal on line 106, as will be described in greater detail below. AGC amplifier 104 is connected to a third amplifier stage 108 which has a differential output connected to a resistor ladder network 110. The other end of resistor ladder network 110 is connected to a reference current source 112. A threshold detector 114 is connected to resistor ladder network 110 and the outputs of the threshold detector are connected to a flip-flop 116 through coupling capacitors 118 and 120. The output of flip-flop 116 carries the reconstituted binary-coded signal and is thus labelled DATA OUTPUT. Threshold detector 114 contains two comparators 122 and 124 which have inputs connected across the resistor ladder network 110.

Also connected across resistor ladder network 110 is a peak detector circuit 126. The peak detector responds to pulses of either polarity and develops a voltage across a capacitor 128, connected to the output of the peak detector, in response to the receipt of pulses. The output of the peak detector is connected to AGC amplifier 104 via line 106, as explained above, to set the gain of this amplifier in accordance with the level of the signals being received. This automatic gain control allows for variations in the amplitude of the optical signal that may be due to variations in fiber-optic cable lengths and the like. The output of peak detector 126 is also connected to an input of a comparator 130 which compares the output signal from the peak detector with a reference voltage from a reference voltage source 132. When the peak detector output signal is above the reference voltage, then comparator 130 produces the link monitor output signal to indicate that the link is good, since pulses are being received over it.

A D.C. feedback amplifier 134 is also connected to the resistor ladder network 110 to provide a D.C. feedback signal to the current-to-voltage converter amplifier for setting a reference level for the quiescent or ½ level of the optical signal and for providing effective A.C. coupling at the input of amplifier 102 without requiring a large series capacitor.

Figure 5:
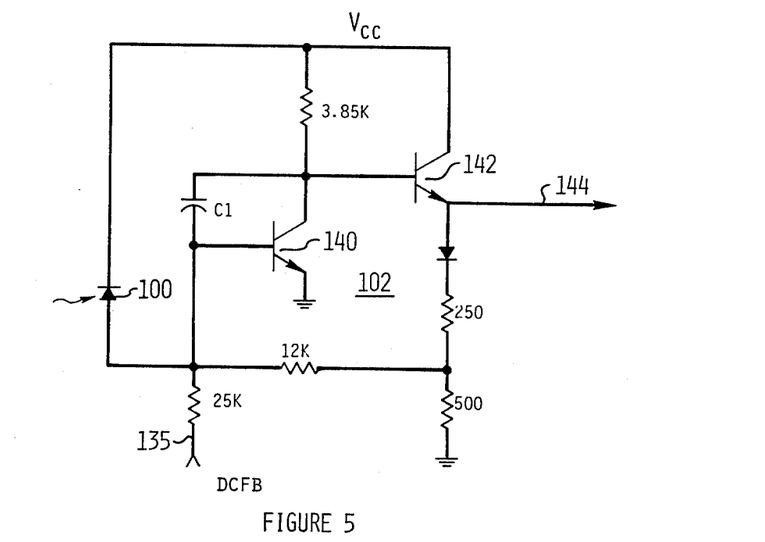
FIG. 5 shows a schematic diagram of a current to voltage amplifier used in the device of FIG. 4.

FIG. 5 shows a detailed, schematic diagram of current-to-voltage amplifier 102. Diode 100 is connected to the base of a common emitter transistor 140 which, in turn, is connected to a common collector transistor 142. Also connected to the input of the voltage-to-current amplifier is the D.C. feedback signal on line 135. The output of the amplifier appears on a line 144.

Figure 6:
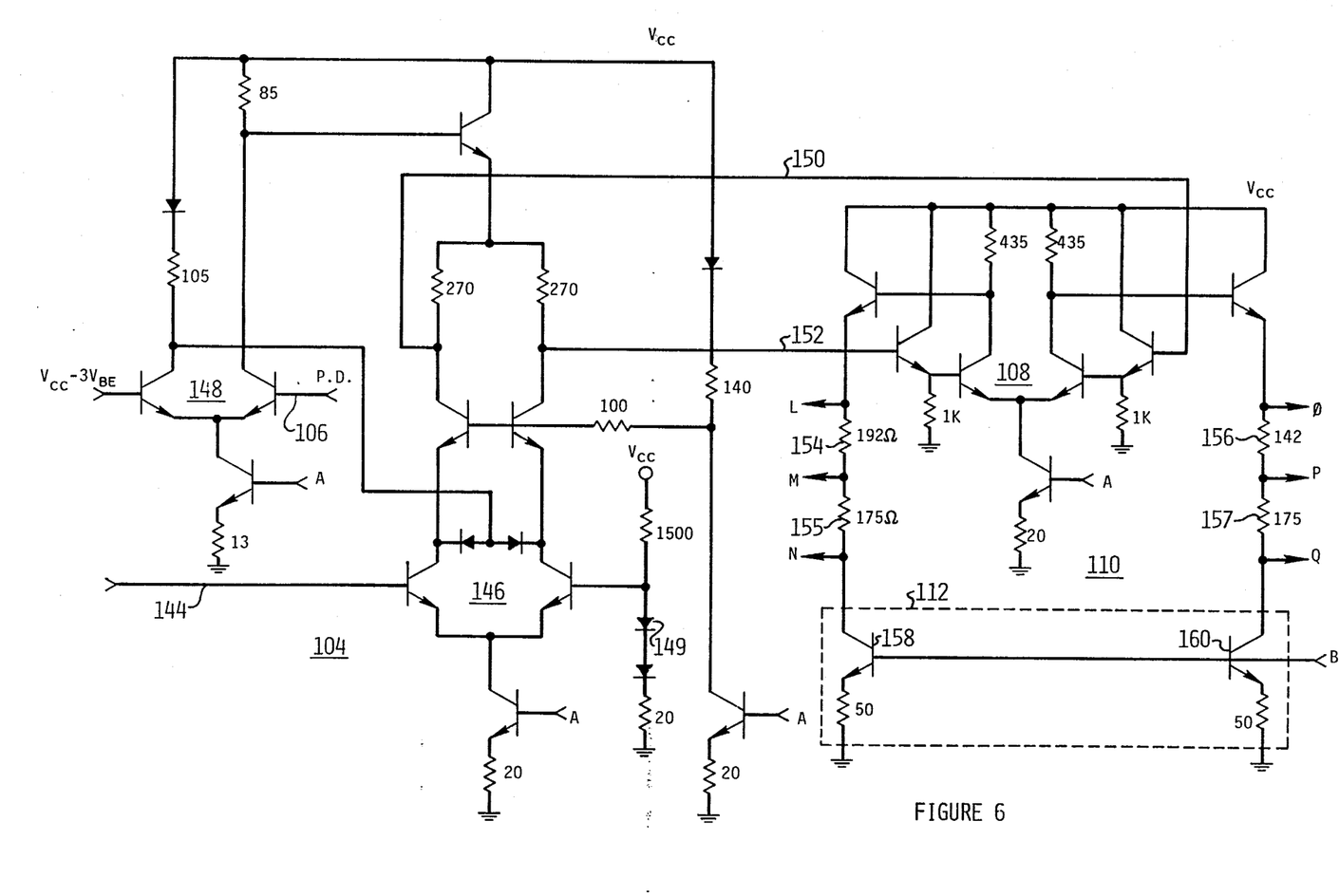
FIG. 6 shows a schematic diagram of an automatic gain controlled amplifier used in the device of FIG. 4.

FIG. 6 shows AGC amplifier 104, amplifier 108, and resistor ladder network 110. The output signal from amplifier 102 on line 144 is connected to one input of a differential pair of transistors 146 in amplifier 104. The other input of differential pair 146 is connected to a voltage reference source 149. The output signal from the peak detector on line 106 is connected to one of a pair of transistors 148. The other transistor in the pair is connected to a voltage reference of $V_{CC} - 3V_{BE}$ where $V_{BE}$ is the voltage drop accross the base-emitter junction of a transistor or across a forward-biased diode, typically 0.7 volts in a silicon device. The output of this amplifier is connected to a pair of diodes which are, in turn, connected to the collectors of the transistor pair 146 and which serve to control the gain of this amplifier. The output of amplifier 104 is connected via lines 150 and 152 to the differential inputs of amplifier 108. The outputs of amplifier 108 are connected to resistor ladder network 110 comprising resistors 154, 155, 156 and 157. The other end of the resistor ladder network is connected to transistors 158 and 160 which have bases that are connected to a voltage reference B, shown elsewhere. The resistor ladder network provides A.C. output signals corresponding to the input pulse code signals with various D.C. offsets required for the subsequent circuits.

Figure 7:
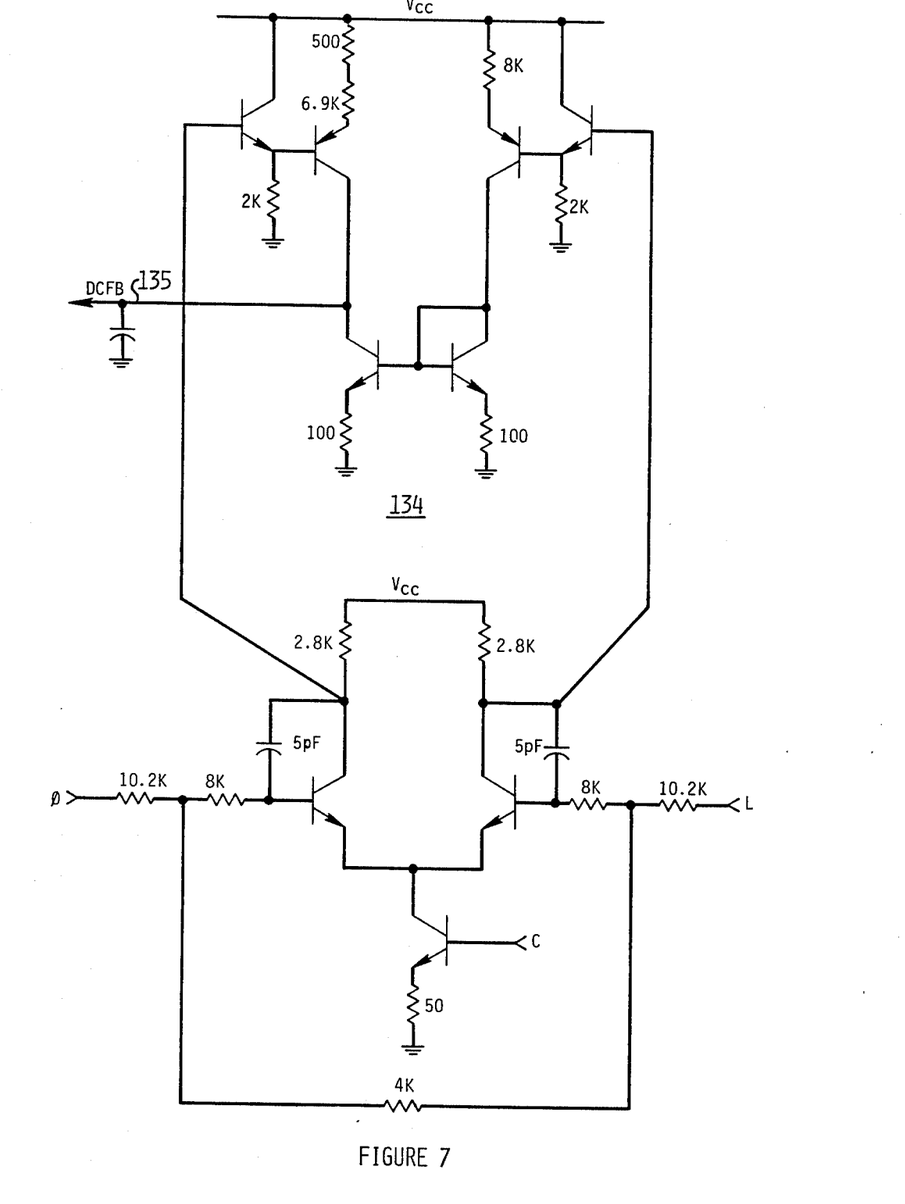
FIG. 7 shows a schematic diagram of a D.C. feedback amplifier used in the device of FIG. 4.

FIG. 7 shows D.C. feedback amplifier 134 which has inputs labelled Φ and L connected to the corresponding points on resistor ladder network 110. D.C. feedback amplifier 134 converts the voltage pulses on the output of amplifier 108 to a current signal which is applied to the input of amplifier 102 via line 135 to set the quiescent level based on the level of the pulses being received.

Figure 8:
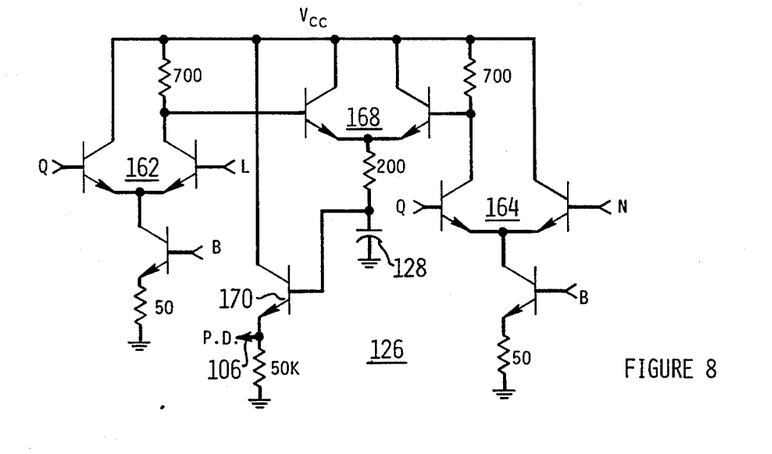
FIG. 8 shows a schematic diagram of a peak detector used in the device of FIG. 4.

FIG. 8 shows a detailed, schematic diagram of peak detector 126 which has inputs Q and L to a differential transistor pair 162 and inputs Φ and N to a differential transistor pair 164. These differential transistor pairs are connected, in turn, to a pair of emitter followers 168 which are connected to capacitor 128 and a buffer transistor 170. The peak detector signal is developed across capacitor 128 and is supplied by buffer transistor 170 to line 106.

Figure 9:
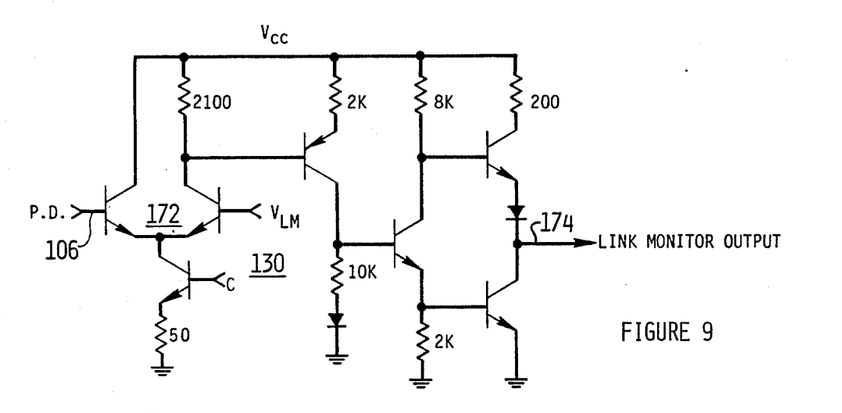
FIG. 9 shows a schematic diagram of a link monitor circuit used in the device of FIG. 4.

In FIG. 9 a schematic diagram of the comparator which produces a link monitor output signal is shown. The peak detector output signal is connected to one input of a differential transistor pair 172 and the other input is connected to receive a reference voltage $V_{LM}$ from reference voltage source 132. When the peak detector output signal is greater than $V_{LM}$, there is a high output signal on link monitor output 174. When the peak detector signal drops below $V_{LM}$, the link monitor output signal drops to a low state, indicating a break in the link, as described above.

Figure 10:
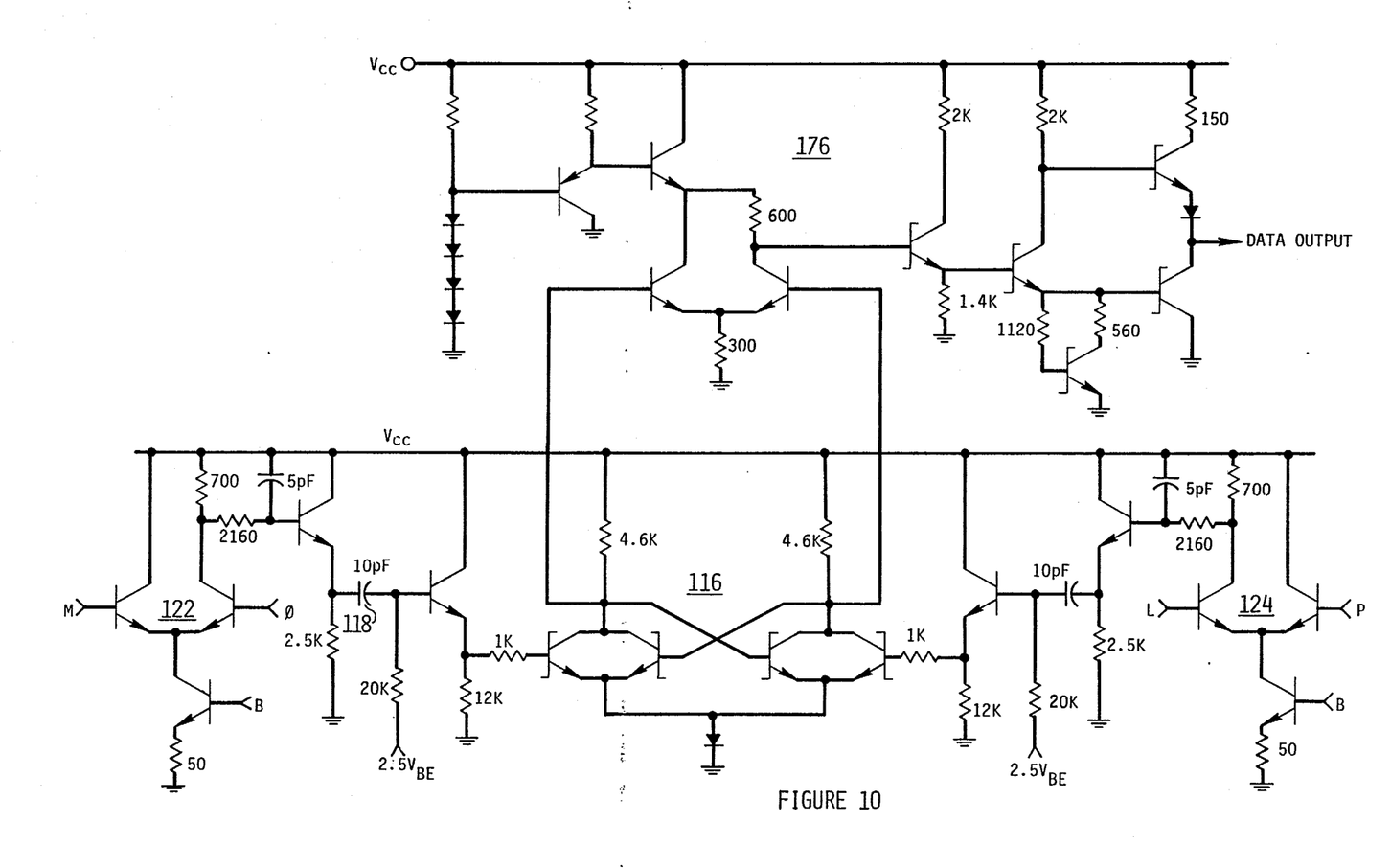
FIG. 10 shows a schematic diagram of threshold detectors and a flip-flop used in the device of FIG. 4.

FIG. 10 shows a detailed, schematic diagram of threshold detector 114 and flip-flop 116. Comparator 122 in threshold detector 114 is connected to outputs M and Φ on resistor ladder network 110, and comparator 124, to outputs L and P. These amplifiers are connected, in turn, to flip-flop 116 through coupling capacitors 118 and 120 respectively. The output of flip-flop 116 is buffered through amplifier 176 to provide a TTL compatible DATA OUTPUT.

Figure 11A:
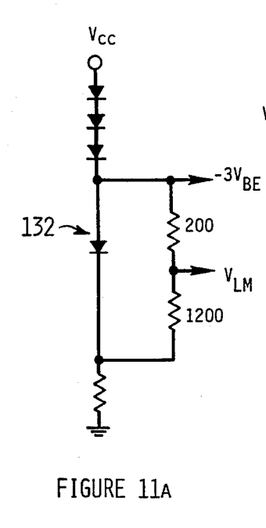
FIGS. 11A, 11B and 11C show schematic diagrams of reference voltage and current circuits.
Figure 11B:
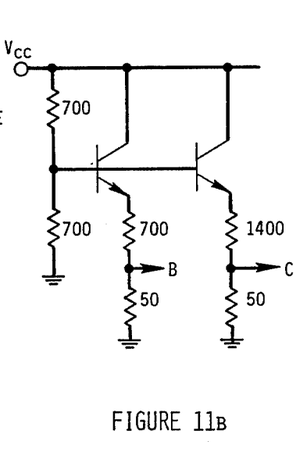
Figure 11C:
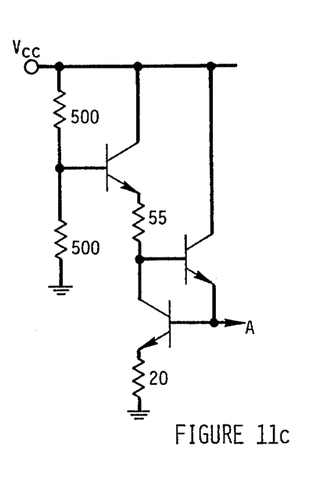

FIGS. 11A, 11B and 11C show examples of reference voltage and current at generating circuits for generating the various reference quantities called for in the preceding figures.

I claim:

1. A method of transmitting binary-coded information comprising the steps of:
   receiving a binary-coded signal having a first and a second state;
   generating a pulse-coded signal in response to the binary-coded signal, the pulse-coded signal comprising: a data pulse of a first polarity when the binary-coded signal changes from the first to the second state, a data pulse of a second polarity when the binary-coded signal changes from the second to the first state, and a refresh pulse having the same polarity as the preceding data pulse when there is no subsequent data pulse for a predetermined time interval.

2. A method as in claim 1 wherein the refresh pulse is repeated periodically until a subsequent data pulse is generated.

3. A method as in claim 2 further comprising the steps of:
   receiving the pulse-coded signal; and
   generating a reconstituted binary-coded signal in response to receipt of the pulse-coded signal.

4. A method as in claim 3 further comprising the step of generating a link monitor signal in response to receipt of the pulse-coded signal.

5. An apparatus for transmitting binary-coded information comprising:
   input means for receiving a binary-coded signal having a first and a second state; and
   pulse generating means connected to the input means for producing a pulse-coded signal comprising a data pulse of a first polarity when the binary-coded signal changes from the first to the second state, a data pulse of a second polarity when the binary-coded signal changes from the second to the first state, and a refresh pulse having the same polarity as the preceding pulse when there is no subsequent pulse for a predetermined time interval.

6. An apparatus as in claim 5 wherein the pulse generating means comprises a first data pulse generating means having an input connected to the input means for responding to the change of the binary-coded signal from the first to the second state by generating the first polarity data pulse on an output of the first data pulse generating means, and a second data pulse generating means having an input connected to the input means for responding to the change of the binary-coded signal from the second to the first state by generating the second polarity data pulse on an output of the second data pulse generating means; and wherein a light-emitting device is coupled to the outputs of the first and second data pulse generating means.

7. An apparatus as in claim 6 wherein the pulse generating means further comprises a timing circuit connected to the inputs and the outputs of the first and second data pulse generating means for receiving a data pulse from one of the first and second data pulse generating means and supplying a signal to the input of the data pulse generating means from which the data pulse was received after a delay substantially equal to the predetermined time interval.

8. An apparatus as in claim 5 further comprising:
reconstituting means for receiving the pulse-coded signal and generating a reconstituted binary-coded signal in response to receipt of the pulse-coded signal; and
transmission means coupling the reconstituted means with the pulse generating means for carrying the pulse-coded signal to the reconstituting means from the pulse generating means.

9. An apparatus as in claim 8 further comprising link monitor means coupled to the transmission means and the reconstituting means for generating a link monitor signal while the pulse-coded signal is being received.

10. An apparatus as in claim 9 wherein the transmission means comprises:
a light-emitting device coupled to the pulse generating means;
a light-transmitting medium coupled to the light-emitting device; and
a light detecting device coupled to the light-transmitting medium and to the reconstituting means.

11. An apparatus as in claim 10 wherein the light-transmitting medium is a fiber-optic cable.

12. An apparatus as in claim 9 wherein the reconstituting means comprises:
input means for receiving the pulse-coded signal;
a signal amplifier connected to the input means;
threshold detector means having an input connected to the signal amplifier for detecting the first and second polarity data pulses and having an output for indicating the receipt of a data pulse of the first or second polarity; and
a memory element connected to the output of the threshold detector means for storing an indication of the polarity of the last received data pulse.

13. An apparatus as in claim 12 wherein the link monitor means comprises a peak detector connected to the signal amplifier and a threshold detector connected to the peak detector.

14. An apparatus as in claim 13 wherein:
the input means includes a light detector;
the signal amplifier includes a variable gain stage having a control input connected to the peak detector; and
the memory element comprises a flip-flop.

* * * * *

UNITED STATES PATENT AND TRADEMARK OFFICE
CERTIFICATE OF CORRECTION

PATENT NO. : 4,027,152
DATED : May 31, 1977
INVENTOR(S) : William W. Brown, Delon C. Hanson, Thomas Hornak It is certified that error appears in the above-identified patent and that said Letters Patent are hereby corrected as shown below:

Column 1, line 17, "he" should read --the--;

line 22, "umambiguously" should read --unambiguously--;

line 31, immediately after "data" insert --rate--.

Signed and Sealed this sixteenth Day of August 1977

[SEAL]

Attest:

RUTH C. MASON
*Attesting Officer*

C. MARSHALL DANN
*Commissioner of Patents and Trademarks*